(12) United States Patent
McBain

(10) Patent No.: US 11,393,175 B2
(45) Date of Patent: Jul. 19, 2022

(54) METHODS AND SYSTEMS FOR DIGITAL TWIN AUGMENTED REALITY REPLICATION OF NON-HOMOGENEOUS ELEMENTS IN INTEGRATED ENVIRONMENTS

(71) Applicant: Network Documentation & Implementation Inc., Bogota, NJ (US)

(72) Inventor: Jorge McBain, Bogota, NJ (US)

(73) Assignee: NETWORK DOCUMENTATION & IMPLEMENTATION INC., Bogota, NJ (US)

(*) Notice: Subject to any disclaimer, the term of this patent is extended or adjusted under 35 U.S.C. 154(b) by 55 days.

(21) Appl. No.: 17/138,732

(22) Filed: Dec. 30, 2020

(65) Prior Publication Data

US 2021/0248825 A1    Aug. 12, 2021

Related U.S. Application Data

(60) Provisional application No. 62/970,922, filed on Feb. 6, 2020.

(51) Int. Cl.
*G06T 19/00* (2011.01)
*G06F 16/901* (2019.01)
(Continued)

(52) U.S. Cl.
CPC .......... *G06T 19/006* (2013.01); *G06F 16/901* (2019.01); *G06N 20/00* (2019.01); *G06T 17/20* (2013.01)

(58) Field of Classification Search
CPC ....... G06T 19/006; G06T 17/20; G06T 19/20; G06T 2219/024; G06T 2219/2021;
(Continued)

(56) References Cited

U.S. PATENT DOCUMENTS

| | | | |
|---|---|---|---|
| 2018/0308287 A1* | 10/2018 | Daniels | .................. G06T 19/20 |
| 2019/0318544 A1* | 10/2019 | Skidmore | ............. G06T 19/006 |

OTHER PUBLICATIONS

U.S. Appl. No. 62/970,922, filed Feb. 6, 2020, titled "Artificial Intelligence Ecosystem Platform—SARI".

* cited by examiner

*Primary Examiner* — Xilin Guo
(74) *Attorney, Agent, or Firm* — Pillsbury Winthrop Shaw Pittman, LLP

(57) ABSTRACT

The present disclosure describes systems and methods for generating digital twin augmented reality replications of non-homogenous elements in integrated environments. One method includes storing a first data structure for a first element in a digital twin augmented reality environment, the first data structure including respective fields for a first function, a first set of relationships, a first physical location, and a first time period of operation. The method also includes storing a second data structure for a second element in the digital twin augmented reality environment, the second data structure includes respective fields for a second function, a second set of relationships, a second physical location, and a second time period of operation. The method can generate a visual representation of the first element and the second element in the digital twin augmented reality environment. The location of the first and second element in the digital twin augmented reality environment is based on the first and second physical location.

18 Claims, 9 Drawing Sheets

(51) Int. Cl.
*G06N 20/00* (2019.01)
*G06T 17/20* (2006.01)

(58) Field of Classification Search
CPC ... G06T 2200/24; G06T 19/00; G06T 19/003; G06F 16/901; G06F 30/00; G06F 3/04815; G06F 21/36; G06F 30/12; G06N 20/00; G06V 20/653; G06V 20/64
See application file for complete search history.

METHODS AND SYSTEMS FOR DIGITAL TWIN AUGMENTED REALITY REPLICATION OF NON-HOMOGENEOUS ELEMENTS IN INTEGRATED ENVIRONMENTS

CROSS-REFERENCE TO RELATED APPLICATIONS

This application claims priority to and is the benefit of U.S. Provisional Application No. 62/970,922, filed Feb. 6, 2020, titled "Artificial Intelligence Ecosystem Platform—SARI," which is incorporated by reference in its entirety.

FIELD OF THE INVENTION

The invention relates to generating digital twin augmented reality real time artificial intelligence hybrid-labor replications of non-homogenous elements in integrated environments.

BACKGROUND

Conventional social and business activities increasingly feature human-to-machine contact in both active and passive manners through the advancement of mobile communications, Internet-of-Things ("IoT") ecosystems and continuous network connectivity. This human-to-machine contact is likely to increase as technology is further integrated into the lives of users. However, current integration is done in a piecemeal fashion form based upon pre-defined hardcoded non customizable, non-specific, static environment heavily depending in multiple humans' backgrounds, emotions, with no authoritative business rules to accomplish an objective. As new technologies and products are developed, these technologies and products are intertwined with different daily tasks. Likewise, as new technological niches are discovered, new products are created to fill these niches. Accordingly, technologic advancement, in particular the coordination of different data sources and formats, operational behavior, business rules, missing critical interdependencies and technology environments, is not done in a coordinated manner leading to both inefficiency in the manner in which new technologies are adopted as well as inefficiency in how tasks are performed and managed after new technologies are adopted.

SUMMARY

In view of this problem, methods and systems are discussed herein for improved integration of different technologies, physical and logical assets within any environments. By doing so, the methods and systems provide enhanced efficiency & reality in the way different technology environments are adopted, used and managed. Furthermore, the methods and systems provide additional functions, such as (i) generating visualization of this adoption, use and management; (ii) processes for optimizing the adoption, use and managements and/or; (iii) predictions for future adoptions, use, and management; (iv) multi customizable interdependencies among all operational activities; (v) predefined, vigilant and executable business rules; (vi) operational stages taking in consideration time, past, present and future (s) business scenarios; (vii) end to end digital automation; (viii) inclusion and execution of Artificial Intelligence; (ix) end to end global enterprise operations; (x) law clauses as AI processes and/or; (xi) hybrid-labor.

At present, conventional systems provide no mechanism for integrating multiple disparate technology data, applications, operational behavior, business mission, end to end management and operational stages environments, such as, but not limited to, transportation (e.g., the transportation of people, goods and services), architectural and industrial design (e.g., the organization, design, construction, post construction and arrangement of facilities, commercial spaces, etc.), digital systems (e.g., the hardware, software, data, applications, application elements, logical and physical connections, device behavior and operating systems) and the means and mechanism of inter-personal communications (e.g., the manner by which people and organizations exchange information). For example, while systems have been developed for transmitting information between two environments, there are still no technical means for introducing top-down organization that is both scalable across the non-homogenous elements of these environments to fully integrate these environments, and their non-homogenous elements, into a central business rules driven artificial intelligence organizational structure ecosystem. For example, conventional systems have no mechanism for expressing rules, contradictions, time, tasks, ownership, critical routes, functions, limitations, and/or requirements of an element from one environment to an element of another or to provide a mechanism for coordinating these elements for a common operation.

The methods and systems overcome these shortcomings of conventional systems by first creating a synchronous artificial real time world intelligence ecosystem for expressing tasks, functions, hybrid-labor, limitations and/or requirements from one environment to another. Namely, the methods and systems generate digital twin augmented reality replications of non-homogenous elements in integrated environments. In order for these digital twin augmented reality replications to provide this functionality, each non-homogenous element of the ecosystem is associated with a physical, logical and operational data structure that describes its tasks, functions, limitations and/or requirements as well as its placement (on a physical, logical level and operational and process level) within the digital twin augmented reality replication. As an example, for a given element (e.g., a hardware server), its digital twin augmented reality replication includes a data, hardware, operational, configuration and applications structure that describes its function (e.g., the physical and logical processes performed by the server), related element (e.g., the computer networks that rely on the server), the physical location of the element (e.g., a hardware stack and location of the hardware stack), and operational characteristics of the element (e.g., time periods of operation, system requirements, interdependencies, capacity, configuration and governance criteria). This element may then be combined with all other elements in the integrated environments to provide a digital twin augmented reality replication of the integrated environments.

In order to facilitate integration of the numerous different non-homogenous physical, logical, and operational elements, each data structure for each element includes a set of business rules, dimensions and standardized fields. This unique information, and the values therein, allow the ecosystem to determine elements required for assigned tasks, the requirements of the element to perform a task, and a means of interfacing with other elements. Furthermore, in order to facilitate user interactions with the ecosystem (e.g., to allow users to request a service update to the hardware server), the ecosystem generates a visual representation of the digital twin augmented reality replication. Additionally, the ecosystem may use the data structures, business rules and values therein, to provide recommendations on optimizing the adoption, use, future deployments and management of one or more elements. Finally, the ecosystem may use operational characteristics such as time periods of operations to generate predictions for future adoptions, use, and management.

In some aspects, there can be an ecosystem for generating digital twin augmented reality replications of non-homogenous elements in integrated environments. The ecosystem can include cloud-based memory configured to store a first data structure for a first element in a digital twin augmented reality environment, wherein the first data structure includes respective fields for a first function performed by the first element, a first set of relationships of the first element to other elements in the digital twin augmented reality environment, a first physical location of the first element and a first time period of operation of the first element. The ecosystem can store a second data structure for a second element in the digital twin augmented reality environment and store a visual representation of the first element in the digital twin augmented reality environment, wherein a location of the first element in the digital twin augmented reality environment is based on the first physical location of the first element. The ecosystem can also have cloud-based control circuitry configured to receive a user request to replace the first element in the digital twin augmented reality environment with a third element, and in response to the user request, populate a third data structure with the first function, the first set of relationships, the first physical location and a third time period of operation. The ecosystem can also include cloud-based I/O circuitry configured to generate for display, in a user interface, the visual representation of the digital twin augmented reality environment with the third element in the first physical location of the first element.

In an interrelated aspect, a method of generating digital replications of non-homogenous elements in integrated environments can include storing a first data structure for a first element in a digital twin augmented reality environment, wherein the first data structure includes respective fields for a first function performed by the first element, a first set of relationships of the first element to other elements in the digital twin augmented reality environment, a first physical location of the first element and a first time period of operation of the first element; storing a second data structure for a second element in the digital twin augmented reality environment, wherein the second data structure includes respective fields for a second function performed by the second element, a second set of relationships of the second element to other elements in the digital twin augmented reality environment, a second physical location of the second element and a second time period of operation of the second element; and generating for display, in a user interface, a visual representation of the first element and the second element in the digital twin augmented reality environment, wherein a location of the first element in the digital environment is based on the first physical location, and wherein a location of the second element in the digital twin augmented reality environment is based on the second physical location.

In another interrelated aspect, a tangible, non-transitory and machine-readable medium storing instructions, that, when executed by a data processing apparatus, causes the data processing apparatus to perform operations comprising those of any of the above method embodiments 1-11.

In yet another interrelated aspect, an ecosystem can include one or more processors and memory storing instructions that, when executed by the processors, cause the processors to effectuate operations comprising those of any of the above method embodiments 1-11.

Various other aspects, features, and advantages of the invention will be apparent through the detailed description of the invention and the drawings attached hereto. It is also to be understood that both the foregoing general description and the following detailed description are examples and not restrictive of the scope of the invention. As used in the specification and in the claims, the singular forms of "a," "an," and "the" include plural referents unless the context clearly dictates otherwise. In addition, as used in the specification and the claims, the term "or" means in "and/or" unless the context clearly dictates otherwise. Additionally, as used in the specification "a portion," refers to a part of, or the entirety of (i.e., the entire portion), a given item (e.g., data) unless the context clearly dictates otherwise.

DETAILED DESCRIPTION OF THE DRAWINGS

In the following description, for the purposes of explanation, numerous specific details are set forth in order to provide a thorough understanding of the embodiments of the invention. It will be appreciated, however, by those having skill in the art, that the embodiments of the invention may be practiced without these specific details or with an equivalent arrangement. In other cases, well-known structures and devices are shown in block diagram form in order to avoid unnecessarily obscuring the embodiments of the invention.

Figure 1A:
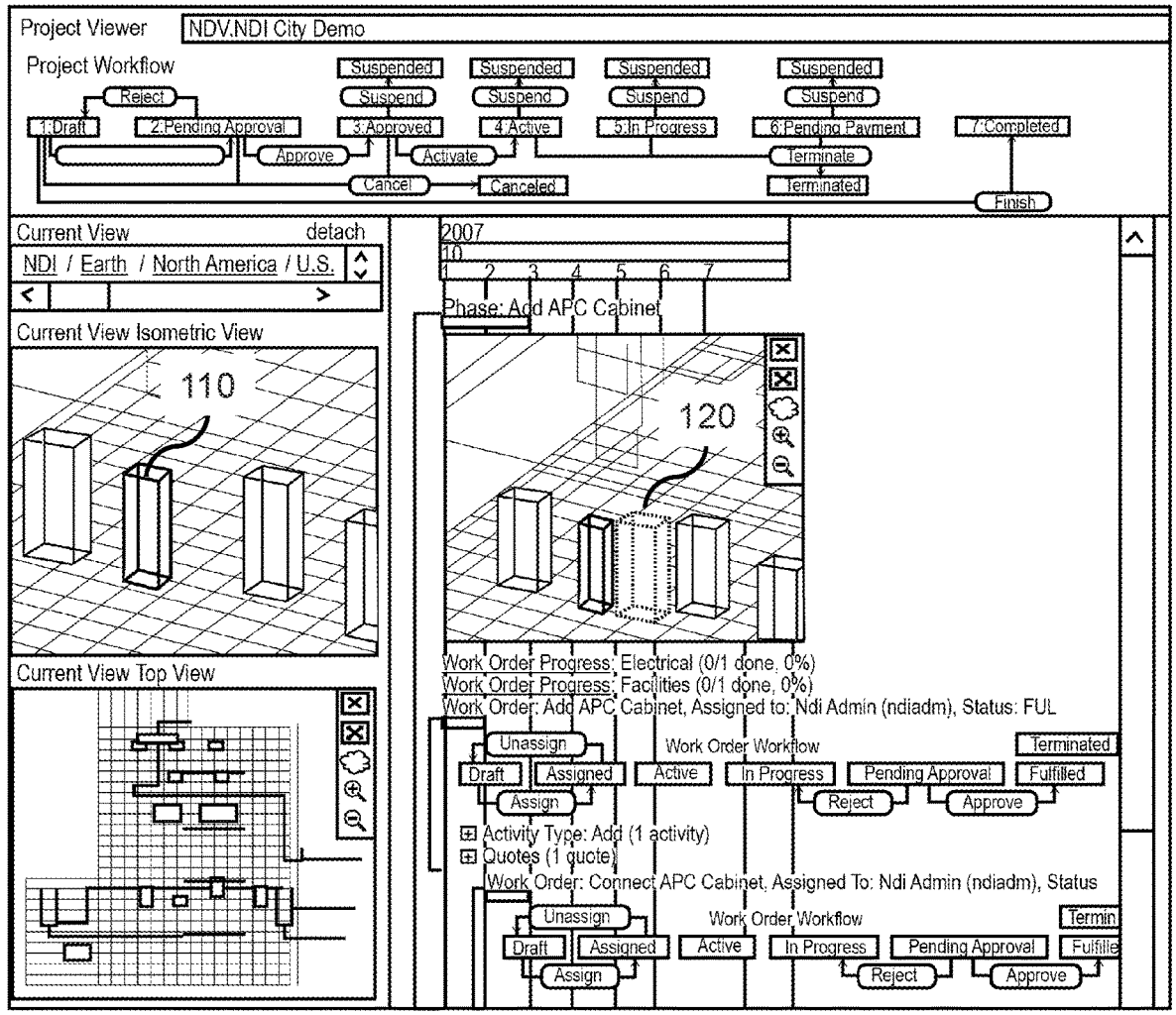
FIG. 1A shows an illustrative graphical user interface depicting generating digital twin augmented reality replications of non-homogenous elements in integrated environments.

FIG. 1A shows an illustrative graphical user interface depicting generating digital replications of non-homogenous elements in integrated environments. Management of real-world twin augmented reality (e.g., physical) systems, logical (e.g., software) ecosystems, and their interactions and relationships can be represented by data structures having respective fields for various attributes (e.g., functions, locations, etc.). As described herein, with these building blocks (also referred to as "elements") of a virtual replica of an twin augmented reality environment, a user or automated ecosystem can control these systems, monitor for problems, determine the effect of replacing or modifying an element, view the integrated system at specified time periods and more.

In addition to replicating physical (e.g., equipment, buildings, etc.) and logical (e.g., computer systems/networks/functions), the elements comprising the virtual replica can include replicas of humans that are performing tasks in the real world. In this way, in addition to performing monitoring and management of replicated twin augmented reality systems according to rules and/or user instruction, the ecosystem can dynamically, and in real-time, track and update based on the actions of replicated humans. In some embodiments, the system may have a series of menu pages and other interactive features as further shown and described in U.S. Provisional Application No. 62/970,922, filed Feb. 6, 2020, titled "Artificial Intelligence Ecosystem Platform—SARI," which is incorporated by reference in its entirety. For example, the main menu may provide access and/or allow users to launch, including but not limited to, the following platforms within its open architecture: My SiteBoard, Current Site Viewer, Future Changes, Business, Logical Views, Desktop and Documents each with its description details. For example, the My SiteBoard Platform allows users to monitor, visualize, act, react and escalate customized data and procedures. Like a dashboard, MySiteBoard enables the user to view real-time situation awareness, data or applications situations, operational actions or business changes in the ecosystem (e.g., further details, samples, summary, features and functions). The Current Site Viewer Platform allows a user to build an infrastructure under the user's own rules, from World Locations to City Level, and from software to data to applications to users to internal devices to cables and all its connections, dependencies and interrelationships (e.g., further details, samples, summary, features and functions). Future Changes Platform allows a user to visualize all aspects of Future Changes and its ramifications in detail, step by step.

For example, the Future Changes application may allow users a direct way to achieve more with less to plan accurately up to the most insignificant detail in a dynamic 3D replica of the world and/or project. The system may include a project planning tool that is fully integrated with 3D visualization, and other capabilities to deliver a centralized and holistic solution to planning for changes in a user's environment or facilities (e.g., further details, samples, summary, features and functions). The Business platform may allow users to perform, configure and monitor day to day operations as well as define a customized AI process for managing changes in your data, service, applications, workforce, environment or facilities. The system also tracks the progress and status of each task assignment and will automatically follow up or escalate with the assignees to ensure that processes are followed thru to completion (see further details, samples, summary, features and functions). The system provides Logical Views platform to automatically generate dynamic Logical views that accurately reflect the relationship between logical symbols and their counterparts in the real physical world.

Unlike the conventional ways of generating logical diagrams using tools like Visio, PowerPoint, or other single purpose tools, the system creates logical diagrams based on the actual connections between the physical and logical intelligent objects (e.g., details, samples, summary, features and functions). The system may include a Desktop application that is a highly customizable platform interface for displaying and monitoring information as desired. The Desktop application may allow users to create their own layout of logical symbols, applications, reporting and monitoring functions, much like laying out documents on your desktop (e.g., further details, samples, summary, features and functions). The Document Manager platform helps a user add related documents to assets, track document versions and distribute document changes. The system links a user's environment or facilities assets to related documents like procurement documents, scanned paper forms, photographs, letters and faxes. The Main Platform Menu may be downloaded into a device in a user's entitlements and allow a user to do so. The system may develop an engine that will perform such activities in a dynamic way executing customized procedures to feed main data base in a future view to visualize its impact on its own physical and logical environment.

The system may also include the following platforms within its open architecture: LiveNote, Reports, What if, Administration, How to, and Playback each with its description details. The LiveNote platform is a dynamic collection of message forums that helps users communicate and collaborate and serves as a repository of experiences and knowledge. Much like an email system, the system lets users communicate by exchanging messages and document attachments. But what makes it special is the ability to link these messages with assets, history, distribution, participants and specific information about specific items. The system also includes a Reports Platform, which is a collection of generic and customized reports. This platform may work in conjunction with My SiteBoard for monitoring changes in the underlying data. The data collected from all the integrated applications within the system spans across multiple trades. From asset information to procurement and financial data. From IT, facilities data to software application and configuration. From the reporting perspective, this opens up endless possibilities for extracting and co-relating information, for the purpose of getting deeper insights of the data. The What if Application is a predictive modeling and future scenario capability that allows enterprise managers to anticipate what will happen with add or change orders, engineering change orders, technology insertions and system upgrades. This feature enhances risk mitigation and granular financial impact (what if scenarios) assessment.

The system may include an Administration platform, which is used for the configuration and set up of it. The system has been designed to allow every application to be driven and configured by entitlements and form menus to different properties. The system may be an entitlement-based application delivering all necessary tools to Manage and configure your Business environment, so that the system can mirror, simulate, and deliver Physical and Logical assets in all its processes related to the Business rules, matching and delivering a new information paradigm. The How To platform helps the user understand the system in a very futuristic way. The How to application takes control of a user's mouse and keyboard and shows step by step all aspects needed to perform, act or go to a specific action or application. The system may visualize new concepts as the way to maintain the application automatically and up to date and not have to reprint manuals. The Playback platform allows all users to edit, write text and choose its voice gender to read its movie creation once is playing mode, it can be distributed to specific participants to have better, precise and effective communication, education and collaboration of actions throughout all users.

FIG. 1A illustrates one example embodiment of the disclosed ecosystem in which a user may monitor the replacement of a computer server in a server room. As shown in FIG. 1, there is a digital twin augmented reality replica of an existing server room 110, with a first server (not shown), a second server 120, and a third server (not shown), 120 being added to replace the first server. The ecosystem can generate an optimized workflow for efficiently adding the server, visualize the current server room based on an existing digital replica of the physical and logical server room and any logical connections. The workflow of various sub-tasks (e.g., adding the server, connecting the server, etc.) can be tracked, monitored, acted upon, reverted, configured and displayed.

Figure 1B:
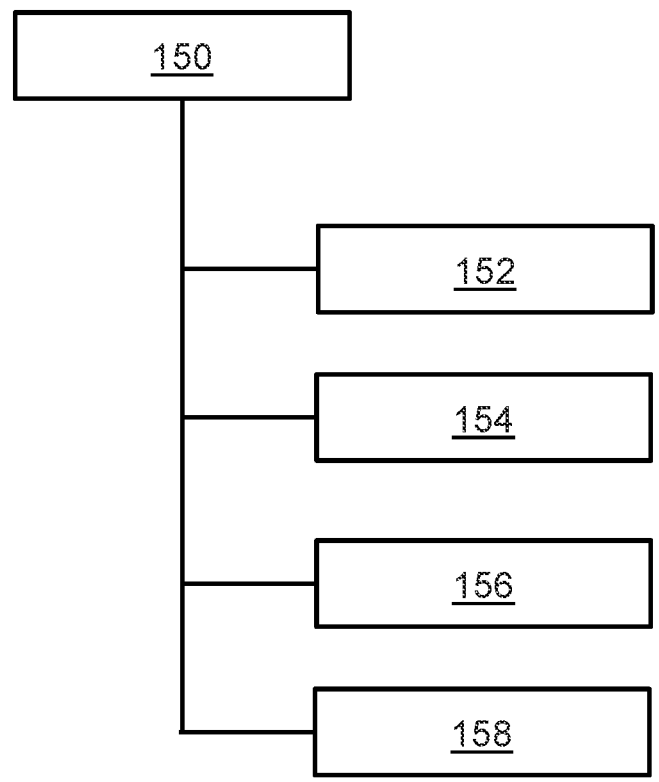
FIG. 1B shows an illustrative data structure that represents an element in the digital twin augmented reality environment, in accordance with one or more embodiments.

FIG. 1B shows an illustrative data structure that represents an element in the digital twin augmented reality environment, in accordance with one or more embodiments. For example, in order for digital twin augmented reality replications to provide this functionality, each non-homogenous element of the ecosystem is associated with a data structure that describes its tasks, functions, limitations and/or requirements as well as its placement (both on a physical, logical level and operational and process level) within the digital twin augmented reality replication. Some implementations can utilize cloud-based computing to allow for distributed and high-speed control of the digital twin augmented reality replicas. The disclosed ecosystem can include cloud-based memory configured to (as illustrated in FIG. 1B): store a first data structure 150 for a first element in a digital environment. The first data structure can include, for example, respective fields (152-158) for a first function 152 performed by the first element, a first set of relationships 154 of the first element to other elements in the digital environment, a first physical location 156 of the first element, and a first time period of operation 158 of the first element. This unique data structure, at least by virtue of its architecture containing numerous respective fields, can thus provide a comprehensive digital replication of the first element (e.g., the server being replaced). However, it is contemplated that additional respective fields could be included as needed to describe the first element (e.g., weight, processing parameters, device model, etc.), with the above first data structure's representative fields being exemplary. Furthermore, not all of the above representative fields are required in a particular data structure, and thus any combination of representative fields can be associated with a given data structure. The disclosed data structure above, and others disclosed elsewhere in this application, can be used with any of the embodiments disclosed in the application (e.g., as in FIG. 1A), in addition to other embodiments as readily envisaged by a person of skill.

As used herein the "data structure" can be embodied in arrays, tables, objects or other suitable data storage constructs. For example, a multidimensional array as a whole can be the data structure with columns or rows corresponding to the representative fields. Similarly, an instance of an object can be stored, with the representative fields being object properties.

As used herein, the term "digital twin augmented reality environment" refers to the replica of one or more elements of a physical, logical or operational ecosystem, but in the digital realm. Storage of the digital twin augmented reality environment can be in, for example, permanent (e.g., hard disk) memory, transient (e.g., RAM memory) or a combination of the two.

As used herein with regard to the data structures, the term "functions" can describe or define the function of the data structure. For example, if the data structure was replicating a data processor, the function could be denoted as e.g., processor, CPU, chip, etc. Similarly, functions can be tied to infrastructure control (e.g., valves, alarms, flow monitors, etc.). Other examples of functions can include computer network controls, such as logical gates, virtual switches, etc.

As used herein with regard to the data structures, the term "relationships" can include logical relationships such as function calls, conditional actions, parent/child and logical connections, such as links between elements (such as illustrated further herein). Relationships can also refer to physical, logical, operational and human relationships, such as physical connections (e.g., electrical/optical wiring between elements, HVAC links, adjacency, ordering (first, second, etc.), and stacking (above/below)).

In some embodiments, a request for a function and/or other operation may be structured as a Digital Direct Robot Connection—DDRC replacing typical API request that includes a URL, body and method. The DDRC request may correspond to one half or above of the DDRC request-response cycle between one or more devices and/or applications to complete the request. For example, the system (e.g., user device 202 (FIG. 2) may communicate in HTTP (Hyper Text Transfer Protocol) through a request-response cycle. To make a valid request, the requester may include a URL (Uniform Resource Locator), method, list of headers, and/or body. The URL may indicate to the verification service what resources to use (e.g., "Function Request"). The body may contain headers and data. The headers may provide metadata about the request (e.g., the name of the requester, the device for which access is needed, etc.) and the body may indicate a function and/or device at issue. As referred to herein, a "digital robot" may include software, programmed to do specific tasks on a computer, also called a workflow. The digital robot may do, more or less, anything as long as the workflow can be defined (e.g., through one or more decision trees, task hierarchies, and/or other workflow rules). The workflow may include an invoice processing phase, a booking phase and execution phase. During the workflow, the system may retrieve and apply, if necessary, rules, exceptions and exception handling. A "rule" may include what the robot should do in a work step if all information and/or circumstances are defined in an expected manner. If there is an unexpected problem (e.g., a divergence from the expected information and/or circumstances), the system may execute an "exception." The system may then perform exception handling steps, which may include a set of rules to execute when an exception occurs.

For example, in an embodiment featuring an email submission process to a digital robot, the digital robot may continuously check an email inbox for a newly submitted task. If received, the system may download the attached submission to a folder and/or check a file extension to determine the file type of the submission (to determine how to extract the information from the submission). The system may then extract all required data (e.g., text, images, etc.) using a determined process (e.g., determined by the system to be the best suited for that filetype). Based on the rules, the system temporary stores the data that is relevant and/or deletes the rest. The system may then connect to operational software to execute the requested submission (e.g., workflows associated with the submission). Alternatively or additionally, the system may verify that the workflows may be completed based on the current system circumstances. If not, the system may execute an exception and/or return an error.

As used herein, with regard to the data structures, the term "physical location" means a location in the physical world. Such can be stored as GPS coordinates, physical address, or any other spatial identifier describing where the object corresponding to the data structure is. Examples of physical locations can include an office building, airport or a computer system (such as if the data structures were elements of a particular computer system).

As used herein with regard to the data structures, the term "time period of operation" can include, for example, continuous operation, scheduled operation, daytime operation and nighttime operation. These time periods of operation can be expressed in hours, minutes, seconds and can also include ranges (e.g., 8 am to 5 pm). Multiple time periods can be combined to establish a scheduled operation. For shifting times such as daytime/nighttime operation, the specific times can be preprogrammed or can be obtained by accessing another computing system with the current ranges/definitions for daytime or nighttime operation (e.g., accessing a server that returns a time range or simply an indication of whether it is day or night as defined locally or at the location of the appropriate element).

Similarly, the ecosystem can also store a second data structure for a second element in the digital environment. Continuing with the example of replacing a server, the second element would conform to the second server and can have respective fields that describe the second server, similar to the first server. Though not depicted in the example of FIG. 1, the ecosystem can also store a visual representation of the first element in the digital environment, where, for example, a location of the first element in the digital environment can be based on the physical location of the first element.

To effect replacement of the first server with a third server, some implementations of the disclosed ecosystem can utilize cloud-based control circuitry configured to receive a user request to replace the first element in the digital environment with a third element (e.g., the third server). In response to the user request, a third data structure can be populated with the first function, the first set of relationships, the first physical location, and a third time period of operation. The third period of time possibly, but not necessarily, being different than the first period of time, for example if the new server has a different schedule of operation.

The ecosystem can also include cloud-based I/O circuitry configured to generate for display, in a user interface, the visual representation of the digital twin augmented reality environment with the third element in the first physical location of the first element. An example of the visual representation is depicted in FIG. 1A, with the third element (e.g., third server) being where the first element (e.g., first server) previously was.

While the above example was provided in the context of replacing a server in a digital (and real-world) environment, it is clearly contemplated that the above data structures can be utilized with any physical or logical components in a replicated digital twin augmented reality environment. Accordingly, the present disclosure should not be limited to the inclusion of only the detailed disclosed embodiments.

The present disclosure next presents an overview of an exemplary ecosystem, including the cloud-based computing structures and exemplary user interface devices. Later figures and disclosure will provide further details of the disclosed data structures and exemplary embodiments for implementation of particular applications, such as future changes to a virtual replica, Information Technology (IT) management, computer network monitoring and maintenance and infrastructure management.

Figure 2:
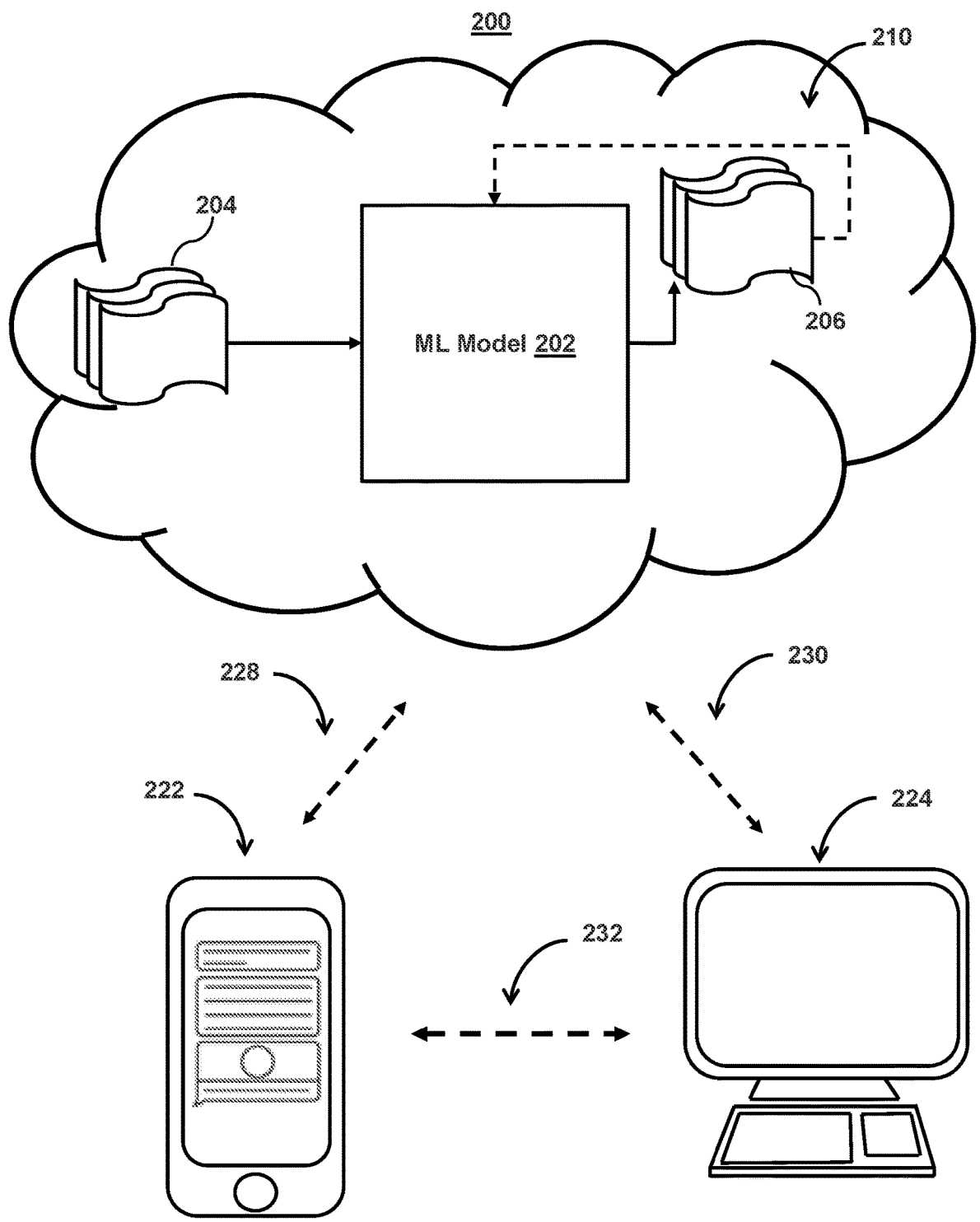
FIG. 2 shows an illustrative system for generating digital twin augmented reality replications of non-homogenous elements in integrated environments, in accordance with one or more embodiments.

FIG. 2 shows an illustrative ecosystem of computer components for generating digital twin augmented reality replications of non-homogenous elements in integrated environments, in accordance with one or more embodiments. For example, system 200 may represent the components used for generating digital twin augmented reality replications of non-homogenous elements in integrated environments. As shown in FIG. 2, system 200 may include mobile device 222 and user terminal 224. While shown as a smartphone and personal computer, respectively, in FIG. 2, it should be noted that mobile device 222 and user terminal 224 may be any computing device, including, but not limited to, a laptop computer, a tablet computer, a hand-held computer, other computer equipment (e.g., a server, a router, a switch), including "smart," wireless, wearable, and/or mobile devices. FIG. 2 also includes cloud components 210. Cloud components 210 may alternatively be any computing device as described above and may include any type of mobile terminal, fixed terminal, or other device. For example, cloud components 210 may be implemented as a cloud computing system and may feature one or more component devices. It should also be noted that system 200 is not limited to three devices. Users may, for instance, utilize one or more other devices to interact with one another, one or more servers, or other components of system 200 such as data, data structure, applications, applications components, business rules, operational procedures, workforce roles, etc. It should be noted that, while one or more operations are described herein as being performed by particular components of system 200, those operations may, in some embodiments, be performed by other components of system 200. As an example, while one or more operations are described herein as being performed by components of mobile device 222, those operations may, in some embodiments, be performed by components of cloud components 210. In some embodiments, the various computers and systems described herein may include one or more computing devices that are programmed to perform the described functions. Additionally, or alternatively, multiple users may interact with their own digital robot replica of themselves as a user with system 200 and/or one or more components of system 200. For example, in one embodiment, a first digital robot user and a second digital robot user may or may not interact with system 200 using two different components (e.g., corresponding to a real human first user and a second real human, respectively).

With respect to the components of mobile device 222, user terminal 224 and cloud components 210, each of these devices may receive content and data via input/output or direct digital robot connection—DDRC (hereinafter "I/O") paths. Each of these devices may also include processors and/or control circuitry and/or data and/or applications to send and receive commands, requests and other suitable data using the I/O paths. The control circuitry may comprise any suitable processing circuitry. Each of these devices may also include a user administrator input interface and/or user administrator output interface (e.g., a display) for use in receiving and displaying data. For example, as shown in FIG. 2, both mobile device 222 and user terminal 224 include a display upon which to display data (e.g., based on recommended contact strategies).

Additionally, as mobile device 222 and user terminal 224 are shown as touchscreen devices, these displays also act as user input interfaces. It should be noted that in some embodiments, the devices may have neither user input interface nor displays and may instead receive, execute, behave, act and display content using another device (e.g., a dedicated display device such as a computer screen and/or a dedicated input device such as a remote control, mouse, voice input, ddrc, etc.). Additionally, the devices in system 200 may run an application (or another suitable program). The application may cause the processors and/or control circuitry to perform operations related to generating recommendations based on records collected and commands to be executed by a third-party during content exchanges between digital robots, business and/or operational rules, users and content sources.

Each of these devices may also include electronic storages. The electronic storages may include non-transitory storage media that electronically stores information. The electronic storage media of the electronic storages may include one or both of (i) system storage that is provided integrally (e.g., substantially non-removable) with servers or client devices or (ii) removable storage that is removably connectable to the servers or client devices via, for example, a port (e.g., a USB port, a firewire port, etc.) or a drive (e.g., a disk drive, etc.). The electronic storages may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.) and/or other electronically readable storage media. The electronic storages may include one or more virtual storage resources (e.g., cloud storage, a virtual private network, and/or other virtual storage resources). The electronic storages may store software algorithms, information determined by the processors, information obtained from servers, information obtained from client devices or other information that enables the functionality as described herein.

FIG. 2 also includes communication paths 228, 230 and 232. Communication paths 228, 230 and 232 may include the Internet, a mobile phone network, a mobile voice or data network (e.g., a 4G or LTE network), a cable network, a public switched telephone network or other types of communications network or combinations of communications networks. Communication paths 228, 230 and 232 may separately or together include one or more communications paths, such as a satellite path, a fiber-optic path, a cable path, a path that supports Internet communications (e.g., IPTV), free-space connections (e.g., for broadcast or other wireless signals) or any other suitable wired or wireless communications path or combination of such paths. The computing devices may include additional communication paths linking a plurality of hardware, software and/or firmware components operating together. For example, the computing devices may be implemented by a cloud of computing platforms operating together as the computing devices.

Cloud components 210 include machine learning model 202. Machine learning model 202 may take inputs 204 and provide outputs 206. The inputs may include multiple data sets such as a training data set and a test data set. Each of the plurality of data sets (e.g., inputs 204) may include data subsets related to user data, contact strategies and results. In some embodiments, outputs 206 may be fed back to machine learning model 202 as input to train machine learning model 202 (e.g., alone or in conjunction with user indications of the accuracy of outputs 206, labels associated with the inputs, or with other reference feedback information). In another embodiment, machine learning model 202 may update its configurations (e.g., weights, biases, or other parameters) based on the assessment of its prediction (e.g., outputs 206) and reference feedback information (e.g., user indication of accuracy, reference labels, or other information). In another embodiment, where machine learning model 202 is a neural network, connection weights may be adjusted to reconcile differences between the neural network's prediction and the reference feedback. In a further use case, one or more neurons (or nodes) of the neural network may require that their respective errors are sent backward through the neural network to facilitate the update process (e.g., backpropagation of error). Updates to the connection weights may, for example, be reflective of the magnitude of error propagated backward after a forward pass has been completed. In this way, for example, the machine learning model 202 may be trained to generate better predictions.

In some embodiments, machine learning model 202 may include an artificial neural network. In such embodiments, machine learning model 202 may include an input layer and one or more hidden layers. Each neural unit of machine learning model 202 may be connected with many other neural units of machine learning model 202. Such connections can be enforcing or inhibitory in their effect on the activation state of connected neural units. In some embodiments, each individual neural unit may have a summation function which combines the values of all of its inputs together. In some embodiments, each connection (or the neural unit itself) may have a threshold function such that the signal must surpass before it propagates to other neural units. Machine learning model 202 may be self-learning and trained, rather than explicitly programmed, and can perform significantly better in certain areas of problem solving, as compared to traditional computer programs. During training, an output layer of machine learning model 202 may correspond to a classification of machine learning model 202 and an input known to correspond to that classification may be input into an input layer of machine learning model 202 during training. During testing, an input without a known classification may be input into the input layer, and a determined classification may be output.

In some embodiments, machine learning model 202 may include multiple layers (e.g., where a signal path traverses from front layers to back layers). In some embodiments, back propagation techniques may be utilized by machine learning model 202 where forward stimulation is used to reset weights on the "front" neural units. In some embodiments, stimulation and inhibition for machine learning model 202 may be more free flowing, with connections interacting in a more chaotic and complex fashion. During testing, an output layer of machine learning model 202 may indicate whether or not a given input corresponds to a classification of machine learning model 202 (e.g., whether a first length of time corresponds to lengths of programming time for previously completed stories by contributors without a required skill).

Figure 3:
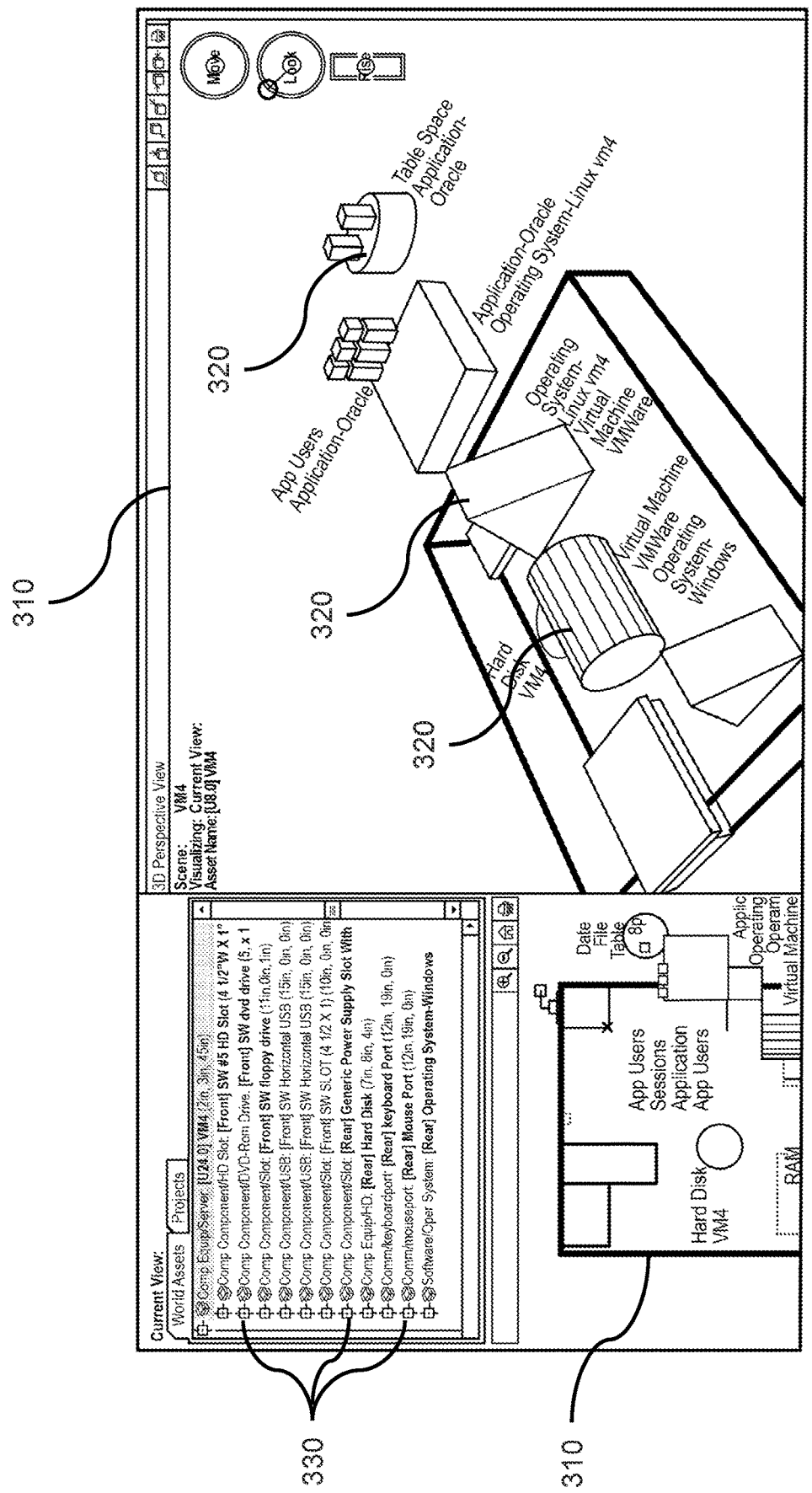
FIG. 3 illustrates the displaying of a visual representation 310 of multiple elements 320 in the digital twin augmented reality environment, in accordance with one or more embodiments.

FIG. 3 illustrates the displaying of a visual digital twin augmented reality representation 310 of multiple elements 320 in the digital twin augmented reality environment, in accordance with one or more embodiments. A more generalized version of the example illustrated by FIGS. 1A-B is provided here to demonstrate the contemplated use of data structures for replication of physical and logical systems. In the case of FIG. 3, it depicts a digital twin augmented reality replica of a computing device. While a number of physical and logical elements are shown, an embodiment of the virtual replica can include storing a first data structure as described with reference to FIGS. 1A-B. Additionally, the system can store a second data structure 330 (with multiple examples of data structures 330 depicted) for a second element in the digital twin augmented reality environment, with again the second data structure including respective fields for a second function performed by the second element, a second set of relationships of the second element to other elements in the digital twin augmented reality environment, a second physical location of the second element and a second time period of operation of the second element. The descriptions of such second data structure and respective fields are similar to those previously described. As shown in FIG. 3, the system can also generate for display, in a user interface, a visual digital twin augmented reality representation of the first element and the second element in the digital twin augmented reality environment, wherein a location of the first element in the digital twin augmented reality environment is based on the first physical location, where a location of the second element in the digital twin augmented reality environment is based on the second physical location. While the above describes generating a visual digital twin augmented reality representation of two elements, it is clearly contemplated that this can be extended to any number of elements, as evidenced by the numerous elements depicted in FIG. 3.

Figure 4A:
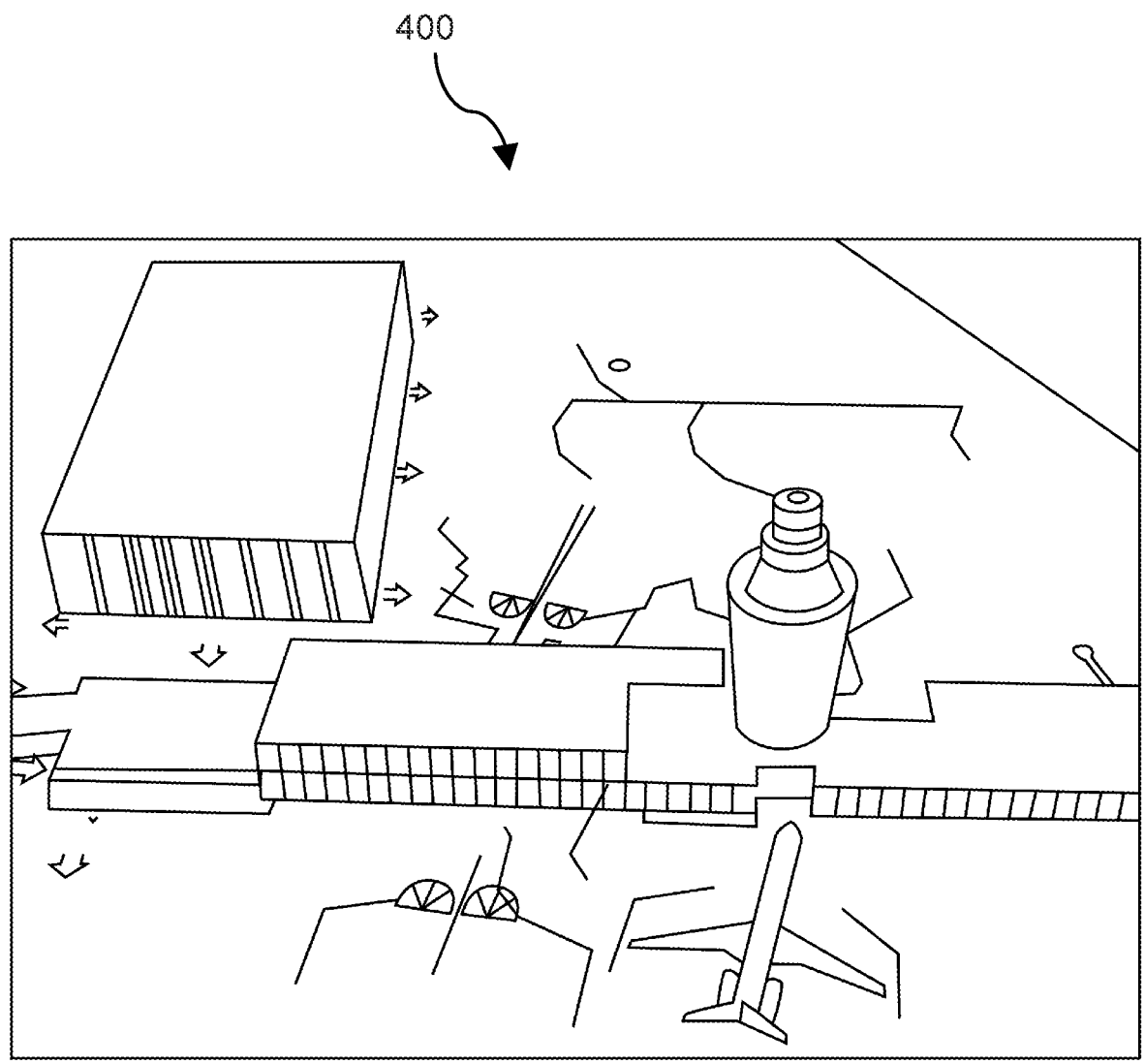
FIGS. 4A and 4B illustrate two types of visual representations that can be implemented by the disclosed ecosystems, in any combination, in accordance with one or more embodiments.
Figure 4B:
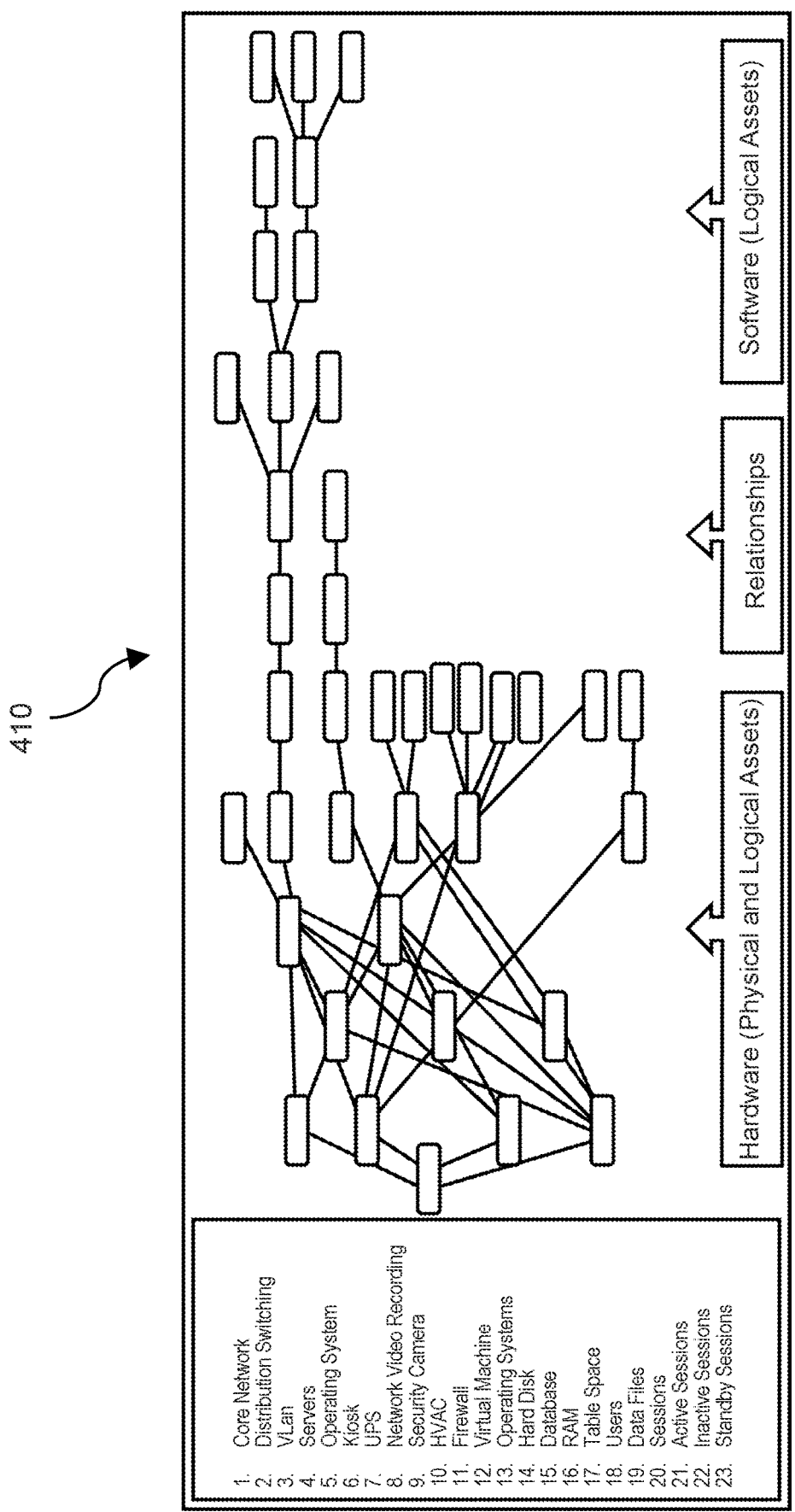

FIGS. 4A and 4B illustrate two types of visual digital twin augmented reality representations that can be implemented by the disclosed ecosystem, in any combination, in accordance with one or more embodiments. For example, visual digital twin augmented reality representations can be any combination of, for example, a 2D rendering, a 3D rendering 400 (FIG. 4A), a wireframe rendering and a connected graph 410 (FIG. 4B). Other suitable types of visual digital twin augmented reality representations can also be implemented, as appropriate.

Also, with reference to FIG. 4B, the disclosed ecosystem can store and generate visualizations for logical, physical and/or interdependent relationships between any of the elements and their corresponding data structures. For example, some digital twin augmented reality implementations can generate, for display in a user interface, a logical, physical and/or interdependencies representation of the first element and the second element in the digital twin augmented reality environment. A location of the first element in the digital twin augmented reality environment can be based on the first set of relationships, and wherein a location of the second element in the digital twin augmented reality environment is based on the second set of relationships. As shown by the example of FIG. 4B, the logical and/or physical and interdependencies representation can indicate respective positions of the first element and the second element (e.g., any of the illustrated elements in the depicted connected graph 410) in a logic chain for performing physical, logical, operational and hybrid labor computer operations. Examples of logic chains can include connected graphs, flow charts, etc.

Figure 5:
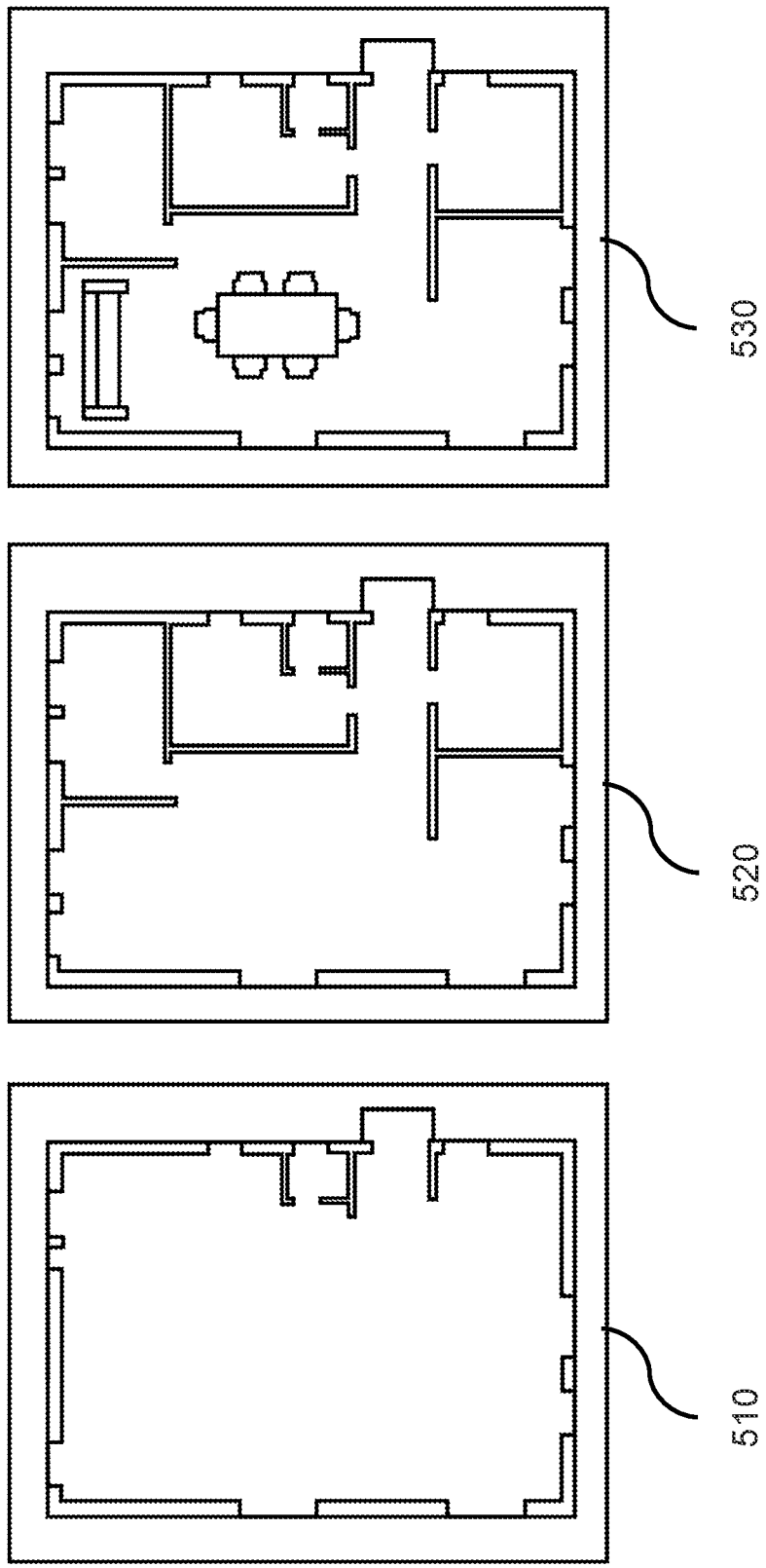
FIG. 5 shows an illustration of a virtual replica at different points in time, in accordance with one or more embodiments.

FIG. 5 shows an illustration of a virtual twin augmented reality replica at different points in time, in accordance with one or more embodiments. The disclosed data structures have respective fields that identify temporal aspects of the data element, for example, when it operates, when it will be added or removed to a replica, etc. Such functionality can not only provide a current snapshot of a system but can also allow analysis and visualization of the ecosystem at any point in its evolution. In terms of the visualization of such, as shown in FIG. 5, the system can respond to queries from a user for the state of the digital environment at a particular time or time period. Continuing with the example of FIG. 5, for a building being constructed or renovated, the ecosystem can include the state of the building at a first period of time 510, a later second period of time 520, and yet later third period of time 530. In one example to allow interaction with a user, the ecosystem can receive a user and/or digital robot input to generate the visual representation of the digital twin augmented reality environment at a given time period. The ecosystem can then retrieve the first time period and the second time period and determine that the first time period corresponds to the given time period and, for example, also determine that the second time period does not correspond to the given time period. In response to determining that the first time period corresponds to the given time period, the system can generate, for display in the user interface, the visual representation of the first element in the digital environment. Accordingly, in response to determining that the second time period does not correspond to the given time period, the ecosystem can generate, for display in the user interface, the digital environment without the visual representation of the second element.

The present disclosure also contemplates a number of applications utilizing the data structures, AI processes, business and operational rules and its workforce roles and functions representing the digital twin augmented reality environment. As described in more detail below, the applications platforms can include generating a digital twin augmented reality activity model, managing infrastructure, monitoring and maintaining computer networks, managing governance, legal, facilities, finance, human resources, technology, operations, users, alliances, consultants and managing any or all information technology system.

One implementation can include receiving an instruction describing a change to the digital twin augmented reality environment. Such instructions can be digital robot and/or user-generated, or ones automatically generated in response to a detected change (e.g., a component failure, data change, application failure, scheduled maintenance, etc.). Utilizing the disclosed data structures herein, the ecosystem can generate, with an artificial intelligence algorithm, business and operational rules and/or digital robots, updates to one or more respective fields of the first and/or second elements in response to the change. Such updates can include, for example, indications that the element is inactive, faulty, damaged, etc. An activity model can be generated that includes work items and when a work item is completed, respective fields of the first and/or second elements in the digital environment are updated. The activity model can be, for example, a flow chart or Gantt chart corresponding to the change. Completion of the work item(s) can be automatically detected by the system (e.g., return to operation) or indicated by digital robot and/or user input. In some implementations, digital robots, machine learning or other AI algorithms can be utilized such that the activity model can be generated based on the change, the first and/or second elements, and the updates. For example, an efficient activity model can account for details of past changes, the current status of the digital twin augmented reality environment, and the particular update requested. In this way, the generated activity model can be more efficient than what might be initially prescribed were such to be made by a human. As with other aspects of the present disclosure, the activity model can be generated for display in a hybrid labor and/or user interface. The generation can be in the form of 2D or 3D or logical or hybrid labor tasks visualizations at a display device.

Another implementation, related to the above, is where the first and second data structures represent physical infrastructure. In some such implementations, the ecosystem operations can then include monitoring alarms associated with the first and second data structures for determination of a triggering event. Examples of alarms are fire alarms, security alarms, equipment alarms, data alarms, application alarms, etc. In response to a triggering event of such alarms, a visual indication of the triggering event can be generated for display in a user interface, as well as a visual logical and/or physical representation of the first and/or second data structures, and a graphical association linking the visual indication and the visual twin augmented reality representation. In this way, the graphical association (e.g., a linking line, arrow, etc.) can clearly communicate, via the user interface, the visual indication (e.g., alarm information) with the visual twin augmented reality representation (e.g., of the alarm or alarming device itself).

The present disclosure also contemplates numerous embodiments for maintaining and updating a computer network, including both its physical, operational, and logical structures. For example, one exemplary implementation for improving the function of computer networks can include monitoring a network (e.g., a computer network) for a network problem based on periodically receiving a number of statuses for various network elements (e.g., including at least one of the first and second elements). In response to the network problem being detected, the ecosystem can generate, act, response, revert with a first artificial intelligence algorithm and/or digital robots, a response to the network problem. Rather than simply stopping with providing a response, to improve the efficiency in resolving the problem, the ecosystem can access, with a second artificial intelligence algorithm and/or digital robots, a database having data entries representing available technicians and automatically assigning a technician based on statuses of the available technicians and the respective fields of the first and/or second elements. For example, the database can be a third-party database associated with a service that provides or digital robots taking actions and/or the technicians. The particulars of the assignment can be dependent on the type of device needing services, the time periods of operation of the device, the location of the device, and so on. Because of the interconnected nature of the elements in the digital twin augmented reality environment, such assignments can also account for the effects of servicing on other elements (e.g., the second element). For example, if servicing the first element would in some cases cause an unacceptable outage of the second element, then the servicing could be scheduled for a different time.

Figure 6:
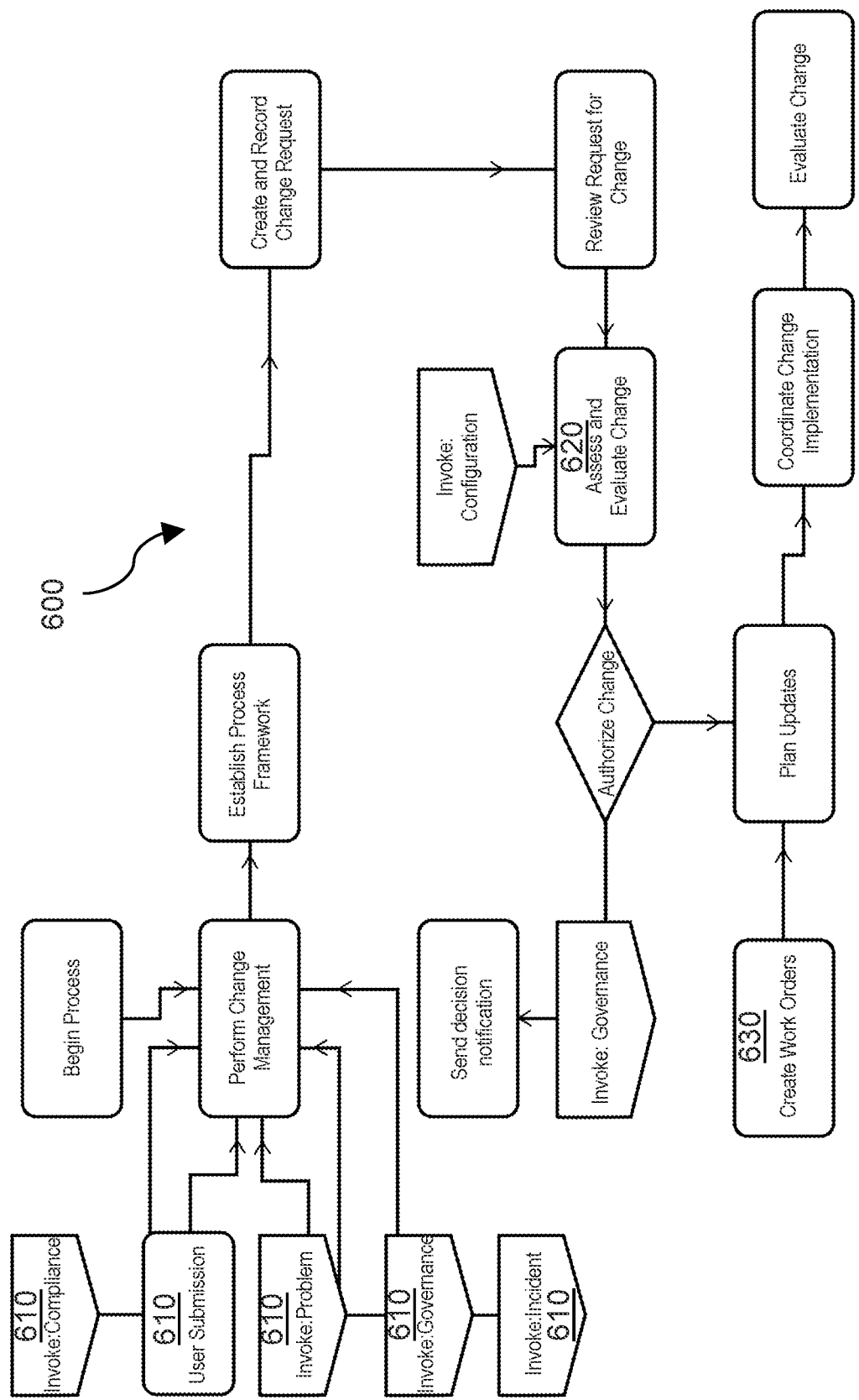
FIG. 6 shows an illustration of a work plan 600 generated to implement a change to the digital twin augmented reality environment, in accordance with one or more embodiments.

FIG. 6 shows an illustration of a work plan 600 generated to implement a change to the digital twin augmented reality environment, in accordance with one or more embodiments. For example, the system can receive, at 610, a change request indicative of a change to the first and/or second elements. The change request can include user input changing one or more of the respective fields, an automatic update to the same, etc. The system can, at 620, generate an assessment of an effect of the change request on the first and/or second elements. The assessment can be generated by, for example, propagating the change and its effects through the interconnected elements in the digital environment, a machine learning algorithm and/or business rules and/or digital robots and/or operational rules and/or humans where the change is modelled based on training the machine learning algorithm with different scenarios, or predictive algorithms that can calculate likely outcomes and effects of the proposed change. In this way, the assessment can be based on interactions of the respective fields of the first and second elements in ways that are likely not possible to be envisioned or determined by a digital robot and/or a human user. The ecosystem can then receive user input authorizing the change or rejecting the change. In response to the change being authorized, at 630, the system can generate a work plan to implement the change and update the respective fields of the first and/or second elements based on the change. In some implementations, the work plan can be similar to the previously-described activity model.

Figure 7:
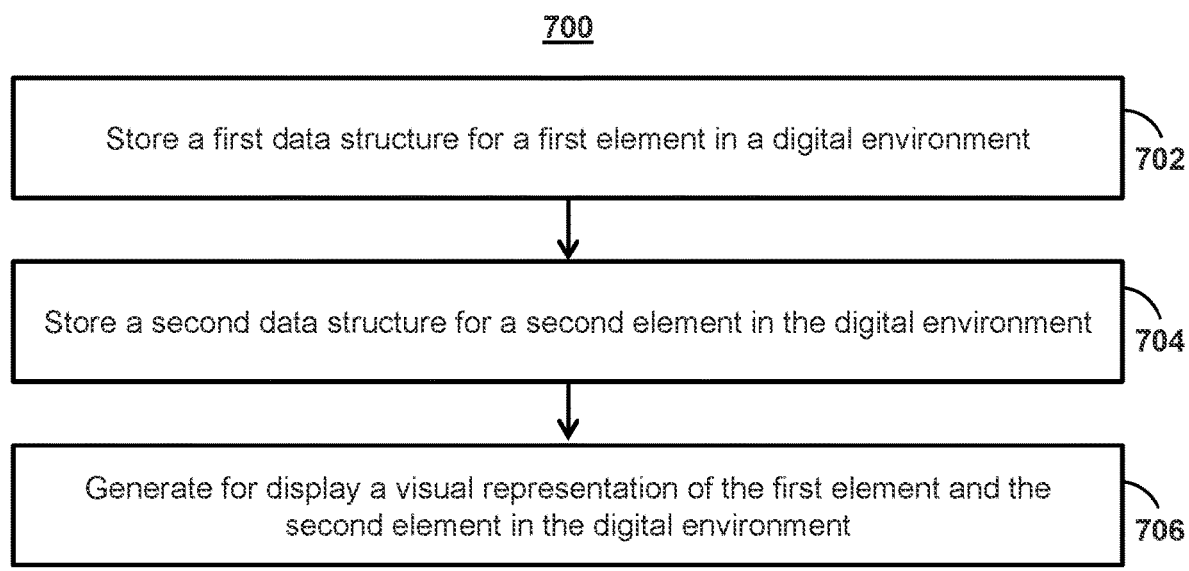
FIG. 7 shows a flow-chart of steps for generating digital twin augmented reality replications of non-homogenous elements in integrated environments.

FIG. 7 shows a flow-chart of steps for generating digital replications of non-homogenous elements in integrated digital twin augmented reality environments. For example, process 700 may represent the steps taken by one or more devices, or performed using one or more of the components, as shown in FIGS. 1-6.

At step 702, process 700 stores (e.g., via one or more components of system 200 (FIG. 2)) a first data structure for a first element in a digital twin augmented reality environment. For example, the system may store a first data structure for a first element in a digital twin augmented reality environment, wherein the first data structure includes respective fields for a first function performed by the first element, a first set of relationships of the first element to other elements in the digital twin augmented reality environment, a first physical location of the first element, and a first time period of operation of the first element.

At step 704, process 700 stores (e.g., via one or more components of system 200 (FIG. 2)) a second data structure for a second element in the digital twin augmented reality environment. For example, the system may store a second data structure for a second element in the digital twin augmented reality environment, wherein the second data structure includes respective fields for a second function performed by the second element, a second set of relationships of the second element to other elements in the digital twin augmented reality environment, a second physical location of the second element, and a second time period of operation of the second element.

In some embodiments, the first and second functions may include one or more of: computing, infrastructure control, and computer network control. For example, the first and second functions may include control of valves, alarms, flow monitors, logical gates, or virtual switches. Additionally or alternatively, in some embodiments, the first and second relationships may include one or more of: a physical connection and a logical connection. For example, the first and second relationships may include an electrical connection, an HVAC connection, a logical order, a data update, an application shutdown or a stacking order. Additionally, or alternatively, in some embodiments, the first and second physical locations may be one of a group comprising: an office building, an airport, and a computer system. For example, the first and second locations may include GPS coordinates, physical addresses, or other identifying coordinates. Additionally, or alternatively, in some embodiments, the first and second time period of operation can include one or more of: continuous operation, scheduled operation, daytime operation, and nighttime operation. For example, the first and second time periods of operation may include 8 am to 5 pm (or any other suitable hour range), Monday-Friday (or any other suitable day range), etc.

At step 706, process 700 generates (e.g., via one or more components of system 200 (FIG. 2)) for display a visual twin augmented reality representation of the first element and the second element in the digital twin augmented reality environment. For example, the ecosystem may generate for display, in a user interface, a visual representation of the first element and the second element in the digital environment, wherein a location of the first element in the digital environment is based on the first physical location, and wherein a location of the second element in the digital twin augmented reality environment is based on the second physical location. In some embodiments, the visual twin augmented reality representation is one or more of: a 2D rendering, a 3D rendering, a wire-frame rendering, and a connected graph. For example, the visual representation may include a 2D rendering of a floor plan or computer system (see, FIG. 1A or FIG. 3), or a 3D rendering as shown by the right half of the depicted computer system in FIG. 3 or the 3D rendering of an airport in FIG. 4A.

In some embodiments, the visual twin augmented reality representation may be used for replacing one or more elements. For example, the ecosystem may generate a visual twin augmented reality representation as an element (e.g., a computer server is replaced) as described above in FIGS. 1A-1B. For example, the ecosystem may store a third data structure for a third element (e.g., a new server being installed). The ecosystem may then receive a digital robot or user request (e.g., a work order) to replace the first element in the digital twin augmented reality environment with a third element. In response to the user request, the ecosystem may populate a third data structure with the first function, the first set of relationships, the first physical location, and a third time period of operation (e.g., characteristics representing the relationships, location, and time period of operation corresponding to the new server). The ecosystem may then generate, for display in a user interface, the visual twin augmented reality representation of the digital environment with the third element in the first physical location of the first element (e.g., the visual representation may now show that the new server has been installed and may reflect it functionality in the visual twin augmented reality representation scheme and operational functions).

In some embodiments, the ecosystem can display visual twin augmented reality representations of the digital twin augmented reality environment as it would exist at a particular point in time. This can be utilized, for example, in viewing future improvements to a building (e.g., as it is constructed or renovated) or even used to view past views of a building (e.g., retrieving the buildings state from archived data). For example, the ecosystem can receive user input to generate the visual representation of the digital twin augmented reality environment at a given time period. For example, the user can enter in a desired date or date range in which they wish to view a building floor plan. The ecosystem can then retrieve the first time period and the second time period. For example, not all of the data structure in memory may be associated with the building in the desired time period. The ecosystem may then determine that the first time period corresponds to the given time period. Also, the system may then determine that the second time period does not correspond to the given time period. For example, by retrieving the first and second (or any number of) time periods for the respective data structures, those that correspond to the time period requested (the first) may be used for the visual twin augmented reality representation while others (the second) may not. The ecosystem may then, in response to determining that the first time period corresponds to the given time period, generate, for display in the user interface, the visual twin augmented reality representation of the first element in the digital twin augmented reality environment. Also, in response to determining that the second time period does not correspond to the given time period, generating, for display in the user interface, the digital twin augmented reality environment without the visual twin augmented reality representation of the second element. For example, if a wall in a building is present in a first time period (which corresponds to the given time period), and a stairwell was removed such that it was in a second time period (e.g., earlier than the first time period), then the visual representation can include the wall, but not the stairwell. One example of the above is depicted in FIG. 5.

In another embodiment, logical representations, such as connected graphs, flow charts, logic chains, or the like, can be generated based on their established relationships and dependencies as stored in the data structures. The ecosystem can generate, for display in a user interface, a logical representation of the first element and the second element in the digital twin augmented reality environment. For example, the logical representation can be a flow chart. A location of the first element in the digital twin augmented reality environment can be based on the first set of relationships, and a location of the second element in the digital twin augmented reality environment is based on the second set of relationships. For example, in a flow chart, a first element can be a decision branch and a second element can be a possible operation based on the decision. The logical representation, as generated by the ecosystem, can indicate respective positions of the first element and the second element in a logic chain for performing computer operations. One example of such is depicted in FIG. 6.

In yet another embodiment, the ecosystem can take an instruction for a desired change to the digital twin augmented reality environment, calculate an optimum way to change it, and generate an activity model to effect the change and display the activity model. For example, if the change were to replace a server, the most efficient way to do so can be determined with the digital twin augmented reality environment and elements updated as the steps in the server replacement are performed. The ecosystem can receive an instruction describing a change to the digital environment. For example, this can be a user command, or an automatic instruction generated on the basis of a scheduled upgrade. The ecosystem can generate, with an artificial intelligence algorithm or digital robots, updates to one or more respective fields of the first and/or second elements in response to the change. For example, when the old server is moved out, the physical location field of the old server can be updated to reflect its new location. The ecosystem can generate an activity model comprising a plurality of work items. For example, the activity model, a Gantt chart, or other process flow diagram. When a work item is completed, respective fields of the first and/or second elements in the digital twin augmented reality environment are updated. For example, when the old server is taken to its new position, its physical location can be updated in the respective field. The ecosystem can generate the activity model based on the change, the first and/or second elements, and the updates. For example, utilizing the interdependency of the data structures in the digital twin augmented reality environment, the activity model can be based on and optimized with such interdependencies accounted for by the ecosystem. The ecosystem can also generate, for display in a user interface, the activity model. One example of an activity model can be seen in the top portion of FIG. 1.

In another embodiment, the ecosystem can leverage the known interdependencies of the elements in the digital twin augmented reality environment to assess the effect of a change. For example, if removing a server would cause a cascading network failure, or replacement of a physical HVAC component would cause a dangerous situation in a part of a building, the assessment can provide this valuable information to the user. The ecosystem can receive a change request indicative of a change to the first and/or second elements. For example, if the first element is a server, the change request could be to take the server offline. The ecosystem can also generate an assessment of an effect of the change request on the first and/or second elements, where the assessment is based on interactions of the respective fields of the first and second elements. For example, the assessment can include determining the increase in network traffic to other servers (such as might be represented by the second element). Whether the second element has the bandwidth to handle the increase in traffic could be part of the assessment. The ecosystem can receive user input authorizing the change or rejecting the change, and in response to the change being authorized, generate a work plan to implement the change and update the respective fields of the first and/or second elements based on the change. For example, if the server going offline was approved, then the ecosystem could determine an activity model or work plan to efficiently execute taking the server offline.

In another embodiment, the ecosystem can automate the fixing of problems in a computer network. For example, the ecosystem can actively monitor a computer network for problems such as a down server, failed wireless router, broken cable, or the like. When a problem is detected, the ecosystem can determine a response (e.g., where, when, and how to fix a cable), and assign the optimal technician with the help of its digital robot (e.g., based on location, availability, skill, etc.) to correct the problem. The ecosystem can monitor a network for a network problem based on periodically receiving statuses for network elements including at least one of the first and second elements. For example, if the first and second elements are servers in the network, the ecosystem can monitor them to see if they are responsive. In response to a network problem being detected, the ecosystem can generate, with a first artificial intelligence algorithm, a response to the network problem. For example, the ecosystem might detect that the server is not responsive and determine, based on algorithms modelling past failures and outcomes of responses, a particular response that is expected to be effective. The ecosystem can also access, with a second artificial intelligence algorithm or a digital robot input, a database having data entries representing available technicians and automatically assigning a technician based on statuses of the available technicians and the respective fields of the first and/or second elements. The second artificial intelligence algorithm can be trained to select the optimal technician based on known outcomes for the various technicians and the nature of the detected problem.

In another embodiment, the ecosystem can monitor for triggering events and graphically display the event and the relevant element of the digital twin augmented reality environment relating to the triggering event. For example, if the digital twin augmented reality environment is representing a building having a number of doors with alarms on them, the ecosystem can monitor their status and display to a user where an alarm has been triggered. The ecosystem can have first and second data structures representing physical infrastructure. For example, the first second data structures can represent doors, windows, hallways, etc. The ecosystem can monitor alarms associated with the first and second data structures for determination of a triggering event. For example, if a physical sensor was tripped, a data structure can be updated to indicate that the alarm it represents was triggered. The ecosystem can generate, for display in a user interface and in response to a triggering event, a visual twin augmented reality indication of the triggering event, a visual twin augmented reality representation of the first and/or second data structures, and a graphical association linking the visual twin augmented reality indication and the visual representation. For example, the first and second data structures could represent doors on a floor plan. The visual twin augmented reality indication of the triggering event can be a box or other graphical display twin augmented reality providing information about the door, the alarm, the triggering event itself, etc. A line, arrow, etc., can be generated to visually link the two in the graphical display, to aid the user in interpreting the event.

It is contemplated that the steps or descriptions of FIG. 7 may be used with any other embodiment of this disclosure. In addition, the steps and descriptions described in relation to FIG. 7 may be done in alternative orders or in parallel to further the purposes of this disclosure. For example, each of these steps may be performed in any order or in parallel or substantially simultaneously to reduce lag or increase the speed of the system or method. Furthermore, it should be noted that any of the devices or equipment discussed in relation to FIGS. 1-6 could be used to perform one or more of the steps in FIG. 7.

The above-described embodiments of the present disclosure are presented for purposes of illustration and not of limitation, and the present disclosure is limited only by the claims which follow. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted that the ecosystems and/or methods described above may be applied to, or used in accordance with, other systems and/or methods.

The present techniques will be better understood with reference to the following enumerated embodiments:

Embodiment 1: A ecosystem for generating digital twin augmented reality replications of non-homogenous elements in integrated environments, the ecosystem comprising cloud-based memory configured to store a first data structure for a first element in a digital twin augmented reality environment, wherein the first data structure includes respective fields for a first function performed by the first element, a first set of relationships of the first element to other elements in the digital twin augmented reality environment, a first physical location of the first element, and a first time period of operation of the first element; store a second data structure for a second element in the digital twin augmented reality environment; store a visual representation of the first element in the digital twin augmented reality environment, wherein a location of the first element in the digital twin augmented reality environment is based on the first physical location of the first element; cloud-based control circuitry configured to: receive a user request to replace the first element in the digital twin augmented reality environment with a third element; in response to the user request, populating a third data structure with the first function, the first set of relationships, the first physical location, and a third time period of operation; cloud-based I/O circuitry configured to: generate for display, in a user interface, the visual twin augmented reality representation of the digital twin augmented reality environment with the third element in the first physical location of the first element.

Embodiment 2: A method of generating digital twin augmented reality replications of non-homogenous elements in integrated environments, the method comprising: storing a first data structure for a first element in a digital twin augmented reality environment, wherein the first data structure includes respective fields for a first function performed by the first element, a first set of relationships of the first element to other elements in the digital twin augmented reality environment, a first physical location of the first element, and a first time period of operation of the first element; storing a second data structure for a second element in the digital twin augmented reality environment, wherein the second data structure includes respective fields for a second function performed by the second element, a second set of relationships of the second element to other elements in the digital twin augmented reality environment, a second physical location of the second element, and a second time period of operation of the second element; and generating for display, in a user interface, a visual representation of the first element and the second element in the digital twin augmented reality environment, wherein a location of the first element in the digital twin augmented reality environment is based on the first physical location, and wherein a location of the second element in the digital twin augmented reality environment is based on the second physical location.

Embodiment 3: The method of any of the preceding embodiments, wherein the first and second functions include one or more of: computing, infrastructure control, and computer network control, wherein the first and second relationships include one or more of: a physical connection and a logical connection, wherein the first and second physical locations are one of a group comprising: an office building, an airport, a computer system, and wherein the first and second time period of operation can include one or more of: continuous operation, scheduled operation, daytime operation, and nighttime operation.

Embodiment 4: The method of any of the preceding embodiments, wherein the visual representation is one or more of: a 2D rendering, a 3D rendering, a wire-frame rendering, and a connected graph.

Embodiment 5: The method of any of the preceding embodiments, further comprising storing a third data structure for a third element; receiving a user request to replace the first element in the digital twin augmented reality environment with a third element; in response to the user request, populating a third data structure with the first function, the first set of relationships, the first physical location, and a third time period of operation; generating, for display in a user interface, the visual representation of the digital environment with the third element in the first physical location of the first element.

Embodiment 6: The method of any of the preceding embodiments, further comprising: receiving a user input to generate the visual twin augmented reality representation of the digital twin augmented reality environment at a given time period; retrieving the first time period and the second time period; determining that the first time period corresponds to the given time period; determining that the second time period does not correspond to the given time period; in response to determining that the first time period corresponds to the given time period, generating, for display in the user interface, the visual twin augmented reality representation of the first element in the digital twin augmented reality environment; and in response to determining that the second time period does not correspond to the given time period, generating, for display in the user interface, the digital environment without the visual representation of the second element.

Embodiment 7: The method of any of the preceding embodiments, further comprising: generating, for display in a user interface, a logical representation of the first element and the second element in the digital twin augmented reality environment, wherein a location of the first element in the digital twin augmented reality environment is based on the first set of relationships, and wherein a location of the second element in the digital twin augmented reality environment is based on the second set of relationships, wherein the logical representation indicates respective positions of the first element and the second element in a logic chain for performing computer operations.

Embodiment 8: The method of any of the preceding embodiments, further comprising: receiving an instruction describing a change to the digital twin augmented reality environment; generating, with an artificial intelligence algorithm and/or digital robots, updates to one or more respective fields of the first and/or second elements in response to the change; generating an activity model comprising a plurality of work items, wherein when a work item is completed, respective fields of the first and/or second elements in the digital twin augmented reality environment are updated, wherein the generation of the activity model is based on the change, the first and/or second elements, and the updates; and generating, for display twin augmented reality in a user interface, the activity model.

Embodiment 9: The method of any of the preceding embodiments, further comprising: receiving a change request indicative of a change to the first and/or second elements; generate an assessment of an effect of the change request on the first and/or second elements, wherein the assessment is based on interactions of the respective fields of the first and second elements; receive user input authorizing the change or rejecting the change; and in response to the change being authorized, generate a work plan to implement the change and update the respective fields of the first and/or second elements based on the change.

Embodiment 10: The method of any of the preceding embodiments, further comprising: monitoring a network for a network problem based on periodically receiving a plurality of statuses for a plurality of network elements including at least one of the first and second elements; in response to the network problem being detected, generate, with a first artificial intelligence algorithm, a response to the network problem; accessing, with a second artificial intelligence algorithm, a database having data entries representing a plurality of available technicians and automatically assigning a technician based on statuses of the plurality of available technicians and the respective fields of the first and/or second elements.

Embodiment 11: The method of any of the preceding embodiments, wherein the first and second data structures represent physical infrastructure, the method further comprising: monitoring a plurality of alarms associated with the first and second data structures for determination of a triggering event; and generating, for display in a user interface and in response to a triggering event, a visual indication of the triggering event, a visual representation of the first and/or second data structures, and a graphical association linking the visual indication and the visual representation.

Tangible, non-transitory, machine-readable medium storing instructions that, when executed by a data processing apparatus, cause the data processing apparatus to perform operations comprising those of any of the above method embodiments 1-11.

An ecosystem comprising: one or more artificial intelligent processes; when executed by the processes, cause the processes to effectuate operations comprising those of any of the above method embodiments 1-11.

What is claimed is:

1. An ecosystem for generating digital twin augmented reality replications of non-homogenous elements in integrated environments, the ecosystem comprising:
    cloud-based memory configured to:
        access a digital twin augmented reality environment;
        store a first data structure for a first element in the digital twin augmented reality environment, wherein the first data structure includes respective fields for a first function performed by the first element, a first set of relationships of the first element to other elements in the digital twin augmented reality environment, a first physical location of the first element, and a first time period of operation of the first element;
        store a second data structure for a second element in the digital twin augmented reality environment;
        store a visual representation of the first element in the digital twin augmented reality environment, wherein a location of the first element in the digital twin augmented reality environment is based on the first physical location of the first element;
    cloud-based control artificial intelligent enterprise processes configured to:
        receive a user request to replace the first element in the digital twin augmented reality environment with a third element;
    in response to the user request, populating a third data structure with the first function, the first set of relationships, the first physical location, and a third time period of operation;
    cloud-based I/O artificial intelligent enterprise processes configured to:
        generate for display, in a user interface, a visual twin augmented reality representation of the digital twin augmented reality environment with the third element in the first physical location of the first element.

2. A method of generating digital twin augmented reality replications of non-homogenous elements in integrated environments, the method comprising:
    accessing a digital twin augmented reality environment;
    storing a first data structure for a first element in the digital twin augmented reality environment, wherein the first data structure includes respective fields for a first function performed by the first element, a first set of relationships of the first element to other elements in the digital twin augmented reality environment, a first physical location of the first element, and a first time period of operation of the first element;
    storing a second data structure for a second element in the digital twin augmented reality environment, wherein the second data structure includes respective fields for a second function performed by the second element, a second set of relationships of the second element to other elements in the digital twin augmented reality environment, a second physical location of the second element, and a second time period of operation of the second element;
    storing a third data structure for a third element;
    receiving a user request to replace the first element in the digital twin augmented reality environment with a third element;
    in response to the user request, populating a third data structure with the first function, the first set of relationships, the first physical location, and a third time period of operation;
    generating for display twin augmented reality, in a user interface, a visual representation of the first element and the second element in the digital twin augmented reality environment, wherein a location of the first element in the digital twin augmented reality environment is based on the first physical location, and wherein a location of the second element in the digital twin augmented reality environment is based on the second physical location; and
    generating, for display in the user interface, the visual twin augmented reality representation of the digital twin augmented reality environment with the third element in the first physical location of the first element.

3. The method of claim 2, wherein the first and second functions include one or more of: governance, legal, facilities, finance, human resources, technology, operations, users B2C, alliances B2B, consultants SME computing, infrastructure control, and computer network control, wherein the first and second relationships include one or more of: a physical connection and a logical connection, wherein the first and second physical locations are one of a group comprising: an office building, an airport, a country, a city, a complex, a data center, an accessible data and/or computer system, and wherein the first and second time period of operation can include one or more of: continuous operation, scheduled operation, past, present and future(s) operational processes, daytime operation, and nighttime operation.

4. The method of claim 2, wherein the visual twin augmented reality representation is one or more of: a 2D rendering, a 3D rendering, a wire-frame rendering, and a connected graph.

5. The method of claim 2, further comprising:
    receiving a user input to generate the visual twin augmented reality representation of the digital twin augmented reality environment at a given time period;
    retrieving the first time period and the second time period;
    determining that the first time period corresponds to the given time period;
    determining that the second time period does not correspond to the given time period;
    in response to determining that the first time period corresponds to the given time period, generating, for display in the user interface, the visual twin augmented reality representation of the first element in the digital twin augmented reality environment; and
    in response to determining that the second time period does not correspond to the given time period, generating, for display in the user interface, the digital twin augmented reality environment without the visual representation of the second element.

6. The method of claim 2, further comprising:
    generating, for display twin augmented reality in a user interface, a logical representation of the first element and the second element in the digital twin augmented reality environment, wherein a location of the first element in the digital twin augmented reality environment is based on the first set of relationships, and wherein a location of the second element in the digital twin augmented reality environment is based on the second set of relationships, wherein the logical representation indicates respective positions of the first element and the second element in a logic chain for performing physical, logical, operational, digital, and/or physical computer operations.

7. The method of claim 2, further comprising:
receiving an instruction describing a change to the digital twin augmented reality environment;
generating, with an artificial intelligence algorithm or digital robots, updates to one or more respective fields of the first and/or second elements in response to the change;
generating an activity model comprising a plurality of work items, wherein when a work item is completed, respective fields of the first and/or second elements in the digital twin augmented reality environment are updated, wherein the generation of the activity model is based on the change, the first and/or second elements, and the updates; and
generating, for display in a user interface, the activity model.

8. The method of claim 2, further comprising:
receiving a change request indicative of a change to the first and/or second elements;
generating an assessment of an effect of the change request on the first and/or second elements, wherein the assessment is based on interactions of the respective fields of the first and second elements;
receiving user input authorizing the change or rejecting the change; and
in response to the change being authorized, generating a work plan to implement the change and update the respective fields of the first and/or second elements based on the change.

9. The method of claim 2, further comprising:
monitoring a network for a network problem based on periodically receiving a plurality of statuses for a plurality of network elements including at least one of the first and second elements;
in response to the network problem being detected, generating, with a first artificial intelligence algorithm and/or digital robots, a response to the network problem; and
accessing, with a second artificial intelligence algorithm and/or digital robots, a database having data entries representing a plurality of available technicians and automatically assigning a technician based on statuses of the plurality of available technicians and the respective fields of the first and/or second elements.

10. The method of claim 2, wherein the first and second data structures represent physical infrastructure, the method further comprising:
monitoring a plurality of alarms associated with the first and second data structures for determination of a triggering event; and
generating, for display in a user interface and in response to a triggering event, a visual indication of the triggering event, a visual twin augmented reality representation of the first and/or second data structures, and a graphical association linking the visual indication and the visual representation.

11. A non-transitory, computer-readable medium for generating digital twin augmented reality replications of non-homogenous elements in integrated environments, comprising instructions that, when executed by one or more processors, cause operations comprising:
accessing a digital twin augmented reality environment;
storing a first data structure for a first element in the digital twin augmented reality environment, wherein the first data structure includes respective fields for a first function performed by the first element, a first set of relationships of the first element to other elements in the digital twin augmented reality environment, a first physical location of the first element, and a first time period of operation of the first element;
storing a second data structure for a second element in the digital twin augmented reality environment, wherein the second data structure includes respective fields for a second function performed by the second element, a second set of relationships of the second element to other elements in the digital twin augmented reality environment, a second physical location of the second element, and a second time period of operation of the second element;
storing a third data structure for a third element;
receiving a user request to replace the first element in the digital twin augmented reality environment with a third element;
in response to the user request, populating a third data structure with the first function, the first set of relationships, the first physical location, and a third time period of operation;
generating for display, in a user interface, a visual representation of the first element and the second element in the digital twin augmented reality environment, wherein a location of the first element in the digital twin augmented reality environment is based on the first physical location, and wherein a location of the second element in the digital twin augmented reality environment is based on the second physical location; and
generating, for display in the user interface, the visual twin augmented reality representation of the digital twin augmented reality environment with the third element in the first physical location of the first element.

12. The non-transitory, computer-readable medium of claim 11, wherein the first and second functions include one or more of: governance, legal, facilities, finance, human resources, technology, operations, users, alliances, consultants, computing, infrastructure control, and computer network control, wherein the first and second relationships include one or more of: a physical connection and a logical connection, wherein the first and second physical locations are one of a group comprising: an office building, an airport, a country, a city, a complex, a data center, an accessible data and/or computer system, and wherein the first and second time period of operation can include one or more of: continuous operation, scheduled operation, daytime operation, and nighttime operation.

13. The non-transitory, computer-readable medium of claim 11, the operations further comprising:
receiving a user input to generate the visual representation of the digital twin augmented reality environment at a given time period;
retrieving the first time period and the second time period;
determining that the first time period corresponds to the given time period;
determining that the second time period does not correspond to the given time period;
in response to determining that the first time period corresponds to the given time period, generating, for display in the user interface, the visual representation of the first element in the digital twin augmented reality environment; and in response to determining that the second time period does not correspond to the given time period, generating, for display in the user interface, the digital twin augmented reality environment without the visual representation of the second element.

14. The non-transitory, computer-readable medium of claim 11, the operations further comprising:
generating, for display in a user interface, a logical representation of the first element and the second element in the digital twin augmented reality environment, wherein a location of the first element in the digital twin augmented reality environment is based on the first set of relationships, and wherein a location of the second element in the digital twin augmented reality environment is based on the second set of relationships, wherein the logical representation indicates respective positions of the first element and the second element in a logic chain for performing computer operations.

15. The non-transitory, computer-readable medium of claim 11, the operations further comprising:
receiving an instruction describing a change to the digital twin augmented reality environment;
generating, with an artificial intelligence algorithm and/or digital robots, updates to one or more respective fields of the first and/or second elements in response to the change;
generating an activity model comprising a plurality of work items, wherein when a work item is completed, respective fields of the first and/or second elements in the digital twin augmented reality environment are updated, wherein the generation of the activity model is based on the change, the first and/or second elements, and the updates; and generating, for display in a user interface, the activity model.

16. The non-transitory, computer-readable medium of claim 11, the operations further comprising:
receiving a change request indicative of a change to the first and/or second elements;
generating an assessment of an effect of the change request on the first and/or second elements, wherein the assessment is based on interactions of the respective fields of the first and second elements;
receiving user input authorizing the change or rejecting the change; and
in response to the change being authorized, generating a work plan to implement the change and update the respective fields of the first and/or second elements based on the change.

17. The non-transitory, computer-readable medium of claim 11, the operations further comprising:
monitoring a network for a network problem based on periodically receiving a plurality of statuses for a plurality of network elements including at least one of the first and second elements;
in response to the network problem being detected, generating, with a first artificial intelligence algorithm and/or digital robots, a response to the network problem; and
accessing, with a second artificial intelligence algorithm and/or digital robots, a database having data entries representing a plurality of available technicians and automatically assigning a technician based on statuses of the plurality of available technicians and the respective fields of the first and/or second elements.

18. The non-transitory, computer-readable medium of claim 11, the operations further comprising:
monitoring a plurality of alarms associated with the first and second data structures for determination of a triggering event; and
generating, for display in a user interface and in response to a triggering event, a visual indication of the triggering event, a visual representation of the first and/or second data structures, and a graphical association linking the visual indication and the visual representation.

* * * * *